United States Patent
Asthana et al.

(10) Patent No.: US 9,455,360 B2
(45) Date of Patent: *Sep. 27, 2016

(54) METHOD OF FABRICATING A METAL WRAP THROUGH SOLAR CELL

(71) Applicant: Crystal Solar, Inc., Santa Clara, CA (US)

(72) Inventors: Ashish Asthana, Fremont, CA (US); Tirunelveli S. Ravi, Saratoga, CA (US); Kramadhati V. Ravi, Atherton, CA (US); Somnath Nag, Saratoga, CA (US)

(73) Assignee: Crystal Solar, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/536,125

(22) Filed: Nov. 7, 2014

(65) Prior Publication Data

US 2015/0187966 A1   Jul. 2, 2015

Related U.S. Application Data

(63) Continuation of application No. 13/208,302, filed on Aug. 11, 2011, now Pat. No. 8,883,552.

(60) Provisional application No. 61/401,400, filed on Aug. 11, 2010, provisional application No. 61/454,363, filed on Mar. 18, 2011.

(51) Int. Cl.
*H01L 31/00* (2006.01)
*H01L 31/0224* (2006.01)
(Continued)

(52) U.S. Cl.
CPC ... *H01L 31/02245* (2013.01); *H01L 31/02168* (2013.01); *H01L 31/03921* (2013.01);
(Continued)

(58) Field of Classification Search
CPC .................. H01L 31/0475; H01L 31/02021; H01L 31/022425; H01L 31/042; H01L 31/022458; H01L 31/02245; H01L 31/02008; H01L 31/0682
See application file for complete search history.

(56) References Cited

U.S. PATENT DOCUMENTS 6,559,479 B1   5/2003   Ludemann
8,883,552 B2 *  11/2014   Asthana ............ H01L 31/02245
                                                 136/252
(Continued)

FOREIGN PATENT DOCUMENTS

WO   WO 2009/071561 A2   6/2009

OTHER PUBLICATIONS

International Search Report and Written Opinion Issued Jul. 16, 2012 for International PCT Application No. PCT/US2011/029708.
(Continued)

*Primary Examiner* — Khiem D Nguyen
(74) *Attorney, Agent, or Firm* — David H. Jaffer; Pillsbury Winthrop Shaw Pittman LLP (57) ABSTRACT

Methods of fabricating metal wrap through solar cells and modules for thin silicon solar cells, including epitaxial silicon solar cells, are described. These metal wrap through solar cells have a planar back contact geometry for the base and emitter contacts. Fabrication of a metal wrap through solar cell may comprise: providing a photovoltaic device attached at the emitter side of the device to a solar glass by an encapsulant, the device including busbars on the device emitter; forming vias through the device base and emitter, the vias terminating in the busbars; depositing a conformal dielectric film over the surface of the vias and the back surface of the base; removing portions of the conformal dielectric film from the ends of the vias for exposing the busbars and from field areas of the base; and forming separate electrical contacts to the busbars and the field areas on the back surface of the solar cell. The solar cells may comprise epitaxially deposited silicon and may include an epitaxially deposited back surface field.

19 Claims, 13 Drawing Sheets

(51) Int. Cl.
- *H01L 31/068* (2012.01)
- *H01L 31/18* (2006.01)
- *H01L 31/0216* (2014.01)
- *H01L 31/0392* (2006.01)

(52) U.S. Cl.
CPC ......... *H01L31/068* (2013.01); *H01L 31/1804* (2013.01); *H01L 31/1892* (2013.01); *Y02E 10/547* (2013.01); *Y02P 70/521* (2015.11)

(56) References Cited

U.S. PATENT DOCUMENTS

| | | |
|---|---|---|
| 2005/0252544 A1 | 11/2005 | Rohatgi et al. |
| 2007/0169808 A1 | 7/2007 | Kherani et al. |
| 2009/0056798 A1 | 3/2009 | Merchant et al. |
| 2009/0227063 A1 | 9/2009 | Ravi et al. |
| 2010/0108130 A1 | 5/2010 | Ravi |
| 2010/0108134 A1* | 5/2010 | Ravi ............... H01L 31/022425 136/256 |
| 2010/0178766 A1* | 7/2010 | Andry ............... H01L 21/76898 438/692 |
| 2010/0240169 A1* | 9/2010 | Petti .................. H01L 21/76254 438/68 |
| 2011/0005582 A1* | 1/2011 | Szlufcik ........... H01L 31/02245 136/252 |
| 2011/0056532 A1 | 3/2011 | Ravi et al. |
| 2012/0000511 A1 | 1/2012 | Gee et al. |

OTHER PUBLICATIONS

International Search Report and Written Opinion Issued Dec. 22, 2011 for International PCT Application No. PCT/US2011/047486.

Kerschaver et al., "Back-contact Solar Cells: A Review," Progress in Photovoltaics: Research and Applications; 2006, vol. 14, pp. 107-123.

\* cited by examiner

Section X-X

Section Y-Y
FIG. 6

Section Y-Y
FIG. 10A

METHOD OF FABRICATING A METAL WRAP THROUGH SOLAR CELL

This application is a continuation of U.S. patent application Ser. No. 13/208,302 filed Aug. 11, 2011, now U.S. Pat. No. 8,883,552, which claims the benefit of U.S. Provisional Application Ser. No. 61/401,400 filed Aug. 11, 2010 and U.S. Provisional Application Ser. No. 61/454,363 filed Mar. 18, 2011, all three of which are incorporated by reference in their entirety herein.

FIELD OF THE INVENTION

The present invention relates generally to solar cells, and more particularly to metal wrap through (MWT) thin epitaxial silicon solar cells.

BACKGROUND OF THE INVENTION

The simplest solar cells have contacts on the front and rear surfaces to collect the negative and positive charge carriers. However the screen-printed metal comprising the front-side contacts blocks a significant area from receiving sunlight, often referred to as 'shadowing'. Some newer architectures have been proposed to address this. One such example of such devices are metal wrap through (MWT) devices, where the thin metal 'fingers' are moved to the rear surface as well, leaving the front with much less metal. This is made possible by drilling tiny vias to connect the front surface with rear-surface contacts. With MWT, this requires about 8-200 holes per wafer.

Figure 1:
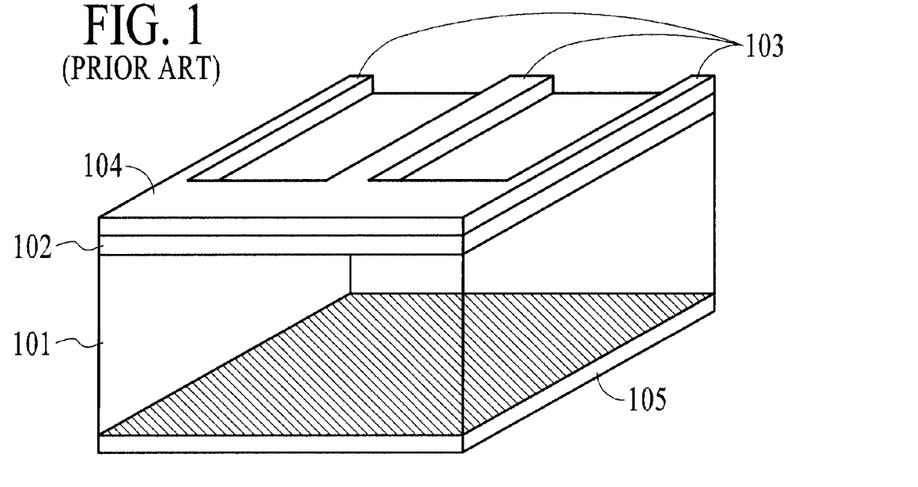
FIG. 1 is a schematic representation of a conventional solar cell.

A schematic representation of part of a prior art conventional bulk crystalline silicon solar cell is depicted in FIG. 1. See Kerschaver et al. "Back-contact Solar Cells: A Review" Prog. Photovolt: Res. Appl. 2006; 14: 107-123. The silicon base 101 is the main part of the mechanical structure. The emitter 102 is located near the top or front surface. A metal grid 103, 104 to extract the carriers from the device contacts each of these silicon regions. Whereas the rear surface is often fully covered by a base contact 105 (as in the drawing), on the front surface the metal grid is the result of a trade-off between having low coverage to limit optical losses and high coverage to limit resistive losses. Most manufacturers apply a front grid consisting of thin parallel lines 103 (fingers) that transport the current to centrally located busbars 104. The busbars are relatively wide and can be used as solder pads for connecting to external leads.

Figure 2:
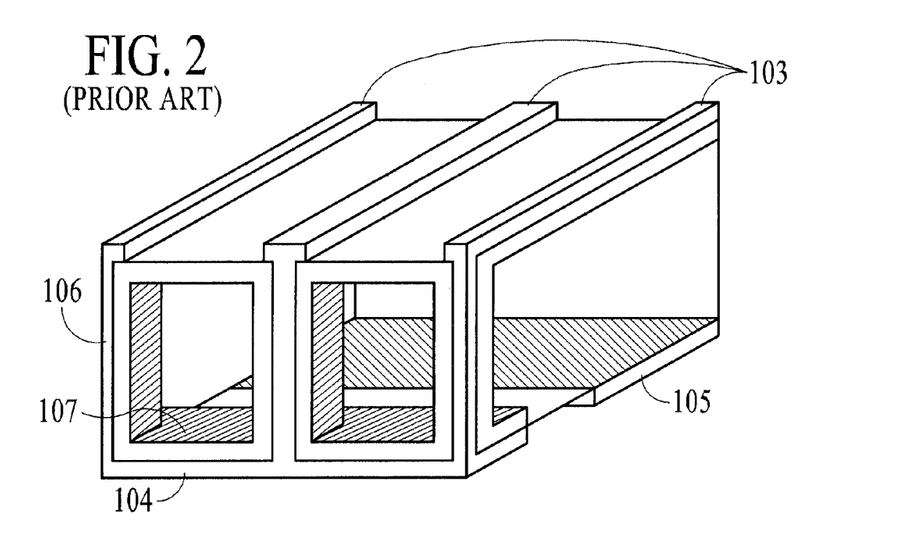
FIG. 2 is a schematic representation of a metallization wrap-through (MWT) solar cell.

The contact wrap-through or metallization wrap-through (MWT) back-contact cell is the concept that is most closely linked to the conventional cell structure. In these cells, the emitter is located near the front surface, but part of the front metallization grid is moved from the front to the rear surface. In the schematic representation of the prior art cell in FIG. 2, this is depicted as the busbar 104 moving from one surface to the other. The remaining front surface grid 103 is connected to the interconnection pads 107 on the rear surface by extending it through a number of openings 106 in the wafer. The base contact 105 is electrically isolated from the interconnection pads 107 as shown in FIG. 2. See Kerschaver et al. "Back-contact Solar Cells: A Review" Prog. Photovolt: Res. Appl. 2006; 14: 107-123.

The MWT cells provide advantages by moving the front bus bar to the back—the shading losses are minimized, with a resulting increase in cell efficiency. However, in addition to performance optimization, there is a need for new back-contact cell/module designs that can make use of new assembly technologies that are inherently more scaleable (i.e., larger and/or thinner cells) with improved cost/throughput compared to current assembly processes using conventional cells. In particular, there is a need for new MWT cell designs and fabrication methods that are compatible with thin epitaxial silicon solar cells.

SUMMARY OF THE INVENTION

The present invention includes metal wrap through (MWT) device structures and methods for fabricating said structures, which are well suited to thin solar cells. The planar back contact geometry of base and emitter contacts in these MWT devices simplifies process flows and assembly methods, thereby reducing cell handling and breakage during stringing and tabbing, as compared with stringing and tabbing practiced for conventional front-to-back contact geometries. Although the present invention is described with examples of thin film single crystal epitaxial solar cell fabrication, the processes of the present invention may be integrated with other solar cell designs and fabrication methods, for example conventional crystalline silicon solar cells, heterostructure solar cells or multi junction solar cells.

According to aspects of the present invention, fabrication of a metal wrap through solar cell may comprise: forming blind vias in the front surface of a base layer; forming an emitter on the front surface of the base layer; depositing an antireflective coating over the emitter; filling the blind vias with electrically conductive material; depositing busbars over the front surface of the base layer, the busbars being configured to connect to the filled blind vias; attaching the front surface of the processed base layer to solar glass using an encapsulant; forming vias from the back surface of the base layer through the base layer, the vias terminating in the filled blind vias; depositing a conformal dielectric film over the surface of the vias and the back surface of the base; removing portions of the conformal dielectric film from the ends of the vias for exposing the filled blind vias and from field areas of the base; and forming separate electrical contacts to the filled blind vias and the field areas, wherein the separate electrical contacts are all accessible on the back surface of the solar cell. The solar cells may comprise epitaxially deposited silicon and may include an epitaxially deposited back surface field.

According to further aspects of the present invention, fabrication of a metal wrap through solar cell may comprise: providing a photovoltaic device attached at the emitter side of the device to a solar glass by an encapsulant, the device including busbars on the device emitter; forming vias through the device base and emitter, the vias terminating in the busbars; depositing a conformal dielectric film over the surface of the vias and the back surface of the base; removing portions of the conformal dielectric film from the ends of the vias for exposing the busbars and from field areas of the base; and forming separate electrical contacts to the busbars and the field areas on the back surface of the solar cell. The solar cells may comprise epitaxially deposited silicon and may include an epitaxially deposited back surface field.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of some embodiments of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention is described herein with reference to two embodiments which are designed to be used with thin film single crystal epitaxial solar cell fabrication processes such as described in U.S. patent application publication nos. 2010/0108134, 2010/0108130, 2009/0227063 and 2011/0056532, all incorporated by reference herein. However, the present invention is not intended to be limited to these particular embodiments, but may be integrated with other solar cell designs and fabrication methods, for example conventional crystalline silicon solar cells, heterostructure solar cells or multi-junction solar cells. The first embodiment of the MWT structure and method of fabrication are schematically shown in FIGS. 3A, 3B, and 4-11.

Figure 3A:
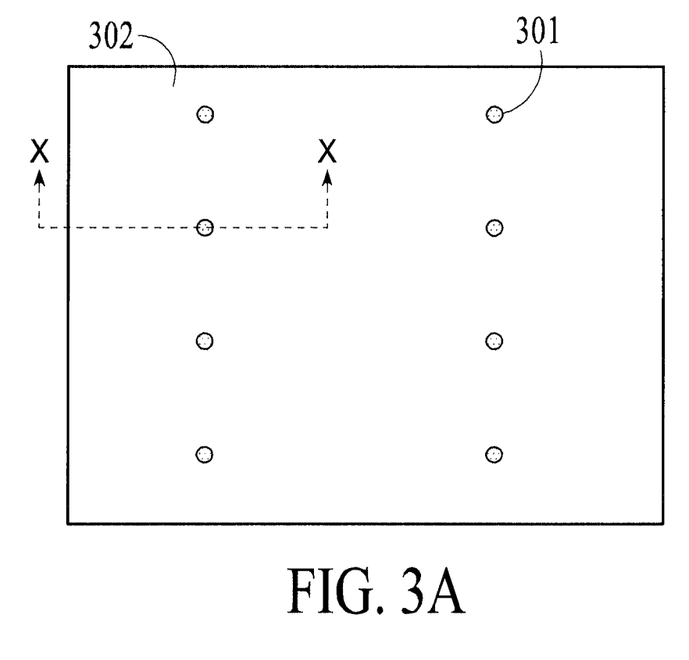
FIG. 3A is a top view of a representation of the fabrication of a MWT solar cell showing the cell after top via formation, according to a first embodiment of the present invention.
Figure 3B:
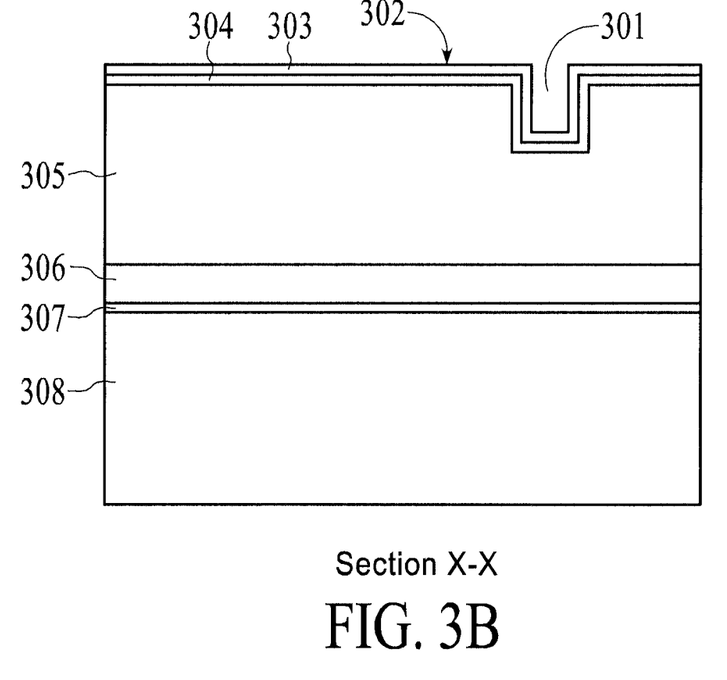
FIG. 3B is a cross-sectional view of the MWT solar cell of FIG. 3A.
Figure 4:
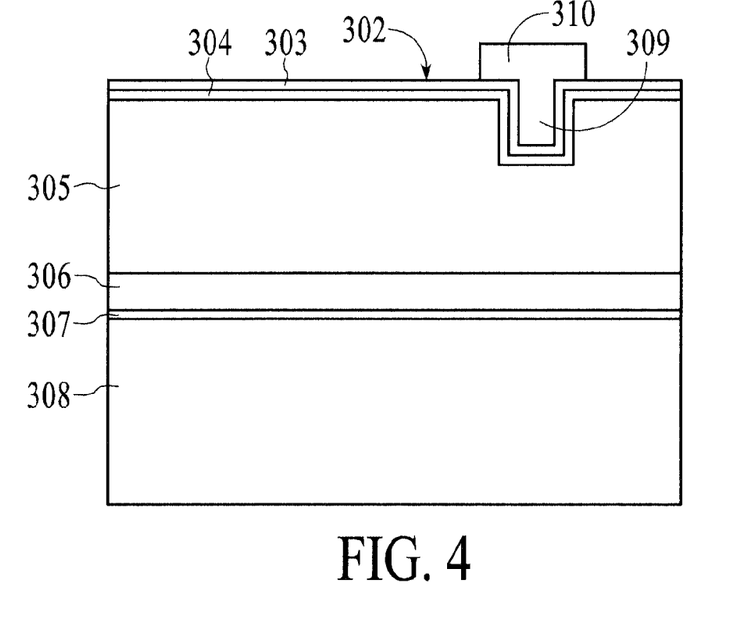
FIG. 4 is a cross-sectional view of the MWT solar cell of FIG. 3B after further steps of via filling and busbar formation, according to some embodiments of the present invention.
Figure 5:
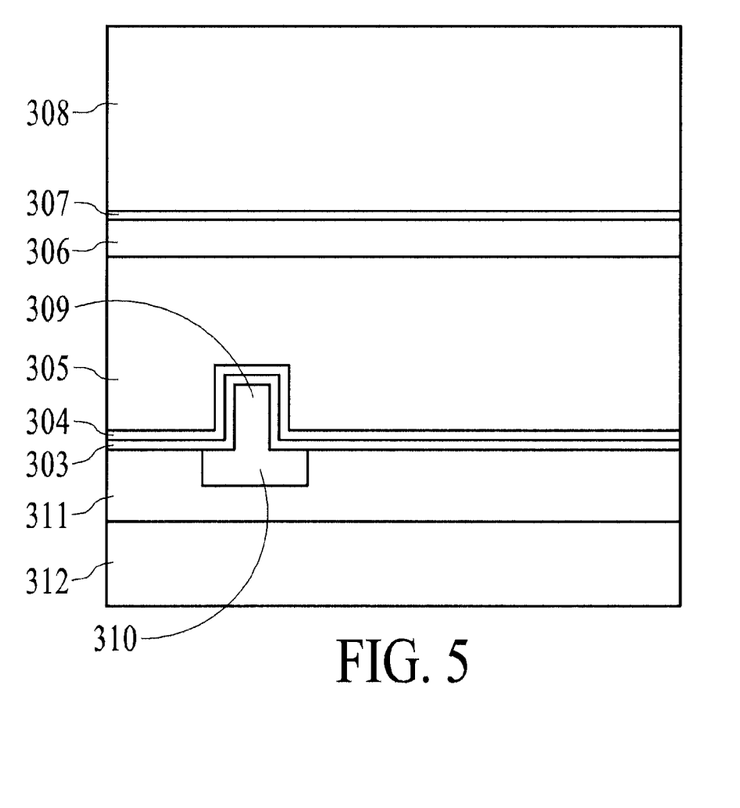
FIG. 5 is a cross-sectional view of the MWT solar cell of FIG. 4 after further steps of encapsulation and attachment to frontside glass, according to some embodiments of the present invention.

FIGS. 3A, 3B, and 4-5 show top and cross-sectional views of a silicon substrate with a porous silicon separation layer and epitaxial silicon layers grown over the porous silicon separation layer. The cross-sections of FIGS. 3B, 4 and 5 are along X-X as indicated in FIG. 3A. Further details of fabrication methods for the separation layer and epitaxial layers are provided in U.S. patent application publication nos. 2010/0108134, 2010/0108130, 2009/0227063 and 2011/0056532, all incorporated by reference herein, for example.

FIG. 3A shows a top view of an array of blind vias 301 which have been formed in the front side 302 of the thin epitaxial silicon films after texture etching of the surface. A silicon nitride antireflection coating (ARC) 303, an $n^{++}$ emitter 304, an epitaxial silicon p-type silicon base 305 (which may be very thin—less than 50 microns thick) and $p^{+}$ epitaxial silicon back side field (BSF) 306 are shown formed on a porous silicon separation layer 307 on a silicon substrate 308. For ease of illustration only 8 vias are illustrated; however, for a typical solar cell there will be in the range of 8 to 200 vias. The number and diameter of the vias can be optimized for a chosen solar cell size, efficiency and expected current-carrying requirements such that the series resistance due to the vias is minimized. Photovoltech (a solar company headquartered in Belgium) has demonstrated that 156 mm multicrystalline solar cells with cell efficiency of approximately 16%, with the ability to operate the cell at 7.8 A and approximately 0.5 V (current and voltages represent the value at maximum power point) with only 16 vias of 125 microns. In this invention, the vias are approximately 30-50 microns deep and 0.2-0.3 mm in diameter, but these dimensions may be adjusted to optimize the cell performance parameters. The vias may be formed by laser drilling, although other drilling methods, such as, plasma etching, ion beam, directed water or abrasive jets, EDM (electric discharge machining) may be used. After via formation, diffusion of the emitter is carried out, typically in a tube furnace or inline system. The emitter of a conventional p-type PV cell is typically diffused by flowing $POCl_3$ in a furnace at an elevated temperature (between 750-900° C.) for a pre-determined time or by spraying a phosphorous containing acid followed by drive-in of the dopant species (phosphorous, in this example) at an elevated temperature (between 750-900° C.) for a pre-determined time. The diffusion is followed by a silicon nitride deposition over the surface of the epitaxial layers and the surface of the blind vias; the silicon nitride forms an ARC. See the cross-sectional representation in FIG. 3B. The nitride for solar applications is typically deposited by plasma-enhanced chemical vapor deposition (PECVD) or by reactive sputtering. The nitride is typically ~70-100 nm thick with a refractive index close to 2 to provide good anti-reflection performance. Typically silane, hydrogen and ammonia gas mixtures are employed in CVD reactors to provide the optimal properties for the silicon nitride, and in reactive sputtering, silicon is sputtered in an ammonia, hydrogen mixture at low pressure. Consequently, there is hydrogen available to passivate the dangling bonds on the surface of the silicon emitter. Furthermore, note that this nitride is an insulator and will provide an insulating barrier between the emitter contact and the base p-type silicon absorber.

FIG. 4 shows a silver metal lug 309 filling the blind via and bus bar 310 formed by screen printing Ag paste. The busbars 310 run perpendicular to the plane of the figure and may be configured as fingers, grids, etc. (Note that herein the term busbar is used to refer generally to busbars, collecting fingers, collecting grids, etc.) Roughly 2-60 microns of Ag is deposited, so that the Ag metal lugs protrude from the surface of the epitaxial layers. This can be accomplished by screen printing the Ag paste in one or multiple printing steps. Commercial Ag pastes that usually have the capability to "fire through" nitride during the firing cycle may be used. Hence, during the firing of the screen printed silver, the Ag fires through the nitride and forms an ohmic contact with the emitter surface in the blind vias and under the busbars.

Next, the silicon wafers are mounted on glass and exfoliated using techniques described in U.S. patent application publication nos. 2010/0108134, 2010/0108130, 2009/0227063 and 2011/0056532, all incorporated by reference herein, for example. FIG. 5 shows a single cell attached by encapsulant 311 to solar PV glass 312, prior to exfoliation from the substrate 308. The encapsulant 311 may be roughly 200 microns thick and the solar glass 312 may be approximately 3 mm thick.

Figure 6:
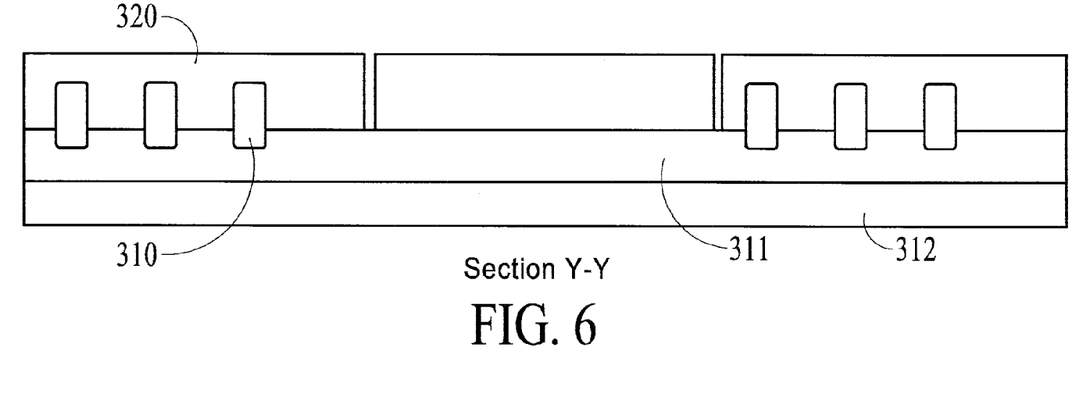
FIG. 6 is a cross-sectional view of a representation of the fabrication of a solar cell module comprised of MWT solar cells as in FIG. 5, according to some embodiments of the present invention.

FIG. 6 shows, in schematic cross-section, multiple cells attached by an encapsulant 311 to a solar PV glass substrate 312, where all of the epitaxial Si cells have been exfoliated from their Si substrates. The silver busbars 310 and epitaxial silicon layers 320 are shown for each cell. For ease of illustration, the ARC, emitter layers, p-base and BSF (back surface field) are nor explicitly shown, also only three wafers are shown attached to the solar glass. In actual practice, a multiplicity of cells will be attached at the same time to the solar glass and exfoliated. For example typical modules have 72-96 cells, and the said number of cells will be attached to the glass. Note that herein the term solar glass is used to refer to front sheet materials with suitable optical transparency, mechanical and handling properties; examples of front sheet materials include suitable glasses, polymers and transparent ceramics.

Figure 7:
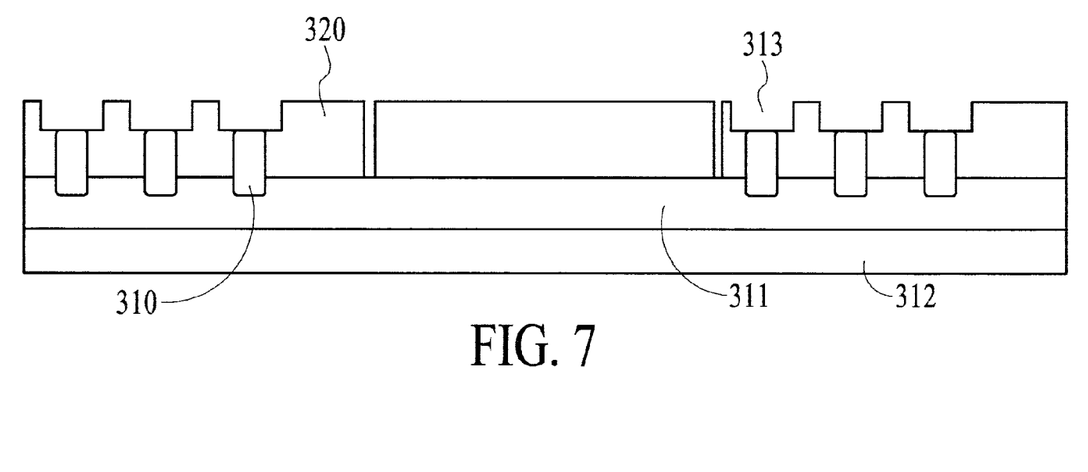
FIG. 7 is a cross-sectional view of the MWT solar cell of FIG. 6 after the further step of backside via formation, according to some embodiments of the present invention.

FIG. 7 shows vias 313 which have been opened up on the backside to connect with the front side busbars using a rough alignment process (simple registration might be sufficient given the hole size requirements and the need for the hole to be completely captured by the busbar). The vias are roughly 300-500 microns in diameter and deep enough to expose the front side busbars (roughly 30 microns deep). These vias may be laser drilled as described above, or other processes may be used, again as described above. A wet clean used for healing laser damage can be done at this time—care being taken in the choice of cleaning chemistry to prevent damage to the solar, glass, metal or encapsulant.

Figure 8:
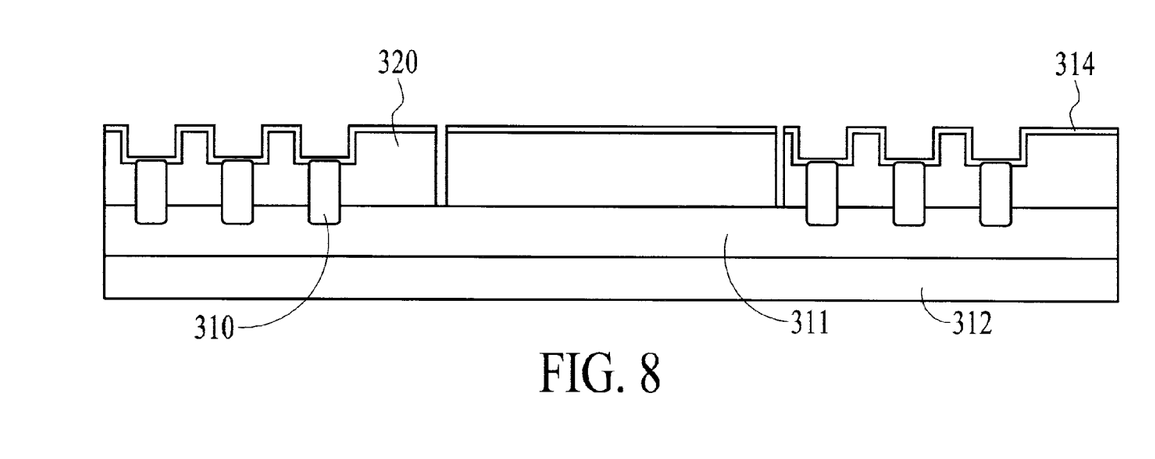
FIG. 8 is a cross-sectional view of the MWT solar cell of FIG. 7 after the further step of backside nitride deposition, according to some embodiments of the present invention.

FIG. 8 shows a conformal coating of silicon nitride dielectric 314 (alternatively, other dielectrics such as, silicon oxide dielectric may be used) covering the backside of the epitaxial layers and the surface of the drilled backside vias. The dielectric liner for the backside vias is provided by the same blanket dielectric layer used for optical light (IR) confinement on the backside.

Figure 9:
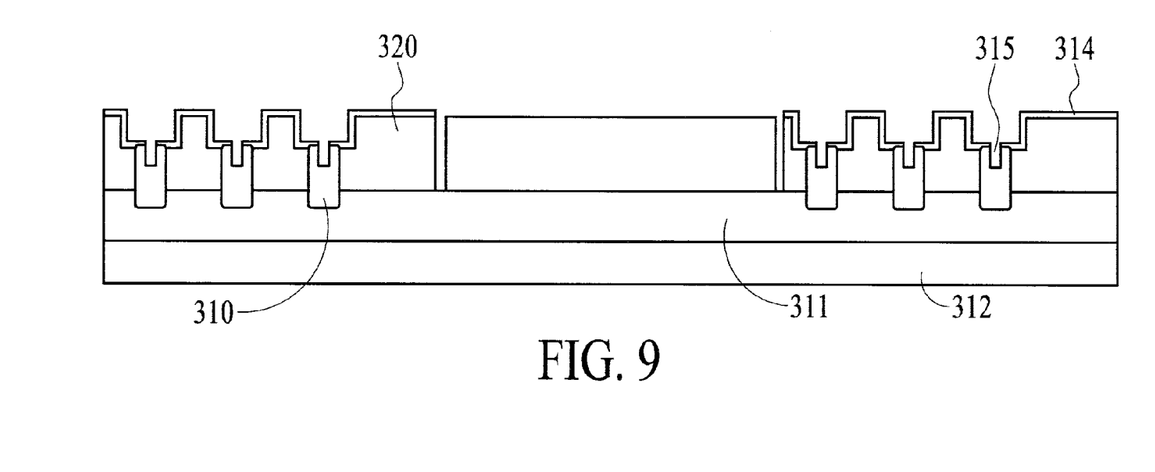
FIG. 9 is a cross-sectional view of the MWT solar cell of FIG. 8 after the further step of dielectric opening formation, according to some embodiments of the present invention.

FIG. 9 shows laser drilled openings 315 formed in the dielectric layer 314 at the frontside busbars; laser drilling is also used at this step to expose the $p^{++}$ layer in field regions to allow formation of back contacts to the base. The vias may be formed by laser drilling, although other drilling methods, such as, plasma etching, ion beam, directed water or abrasive jets, EDM (electric discharge machining) may be used.

Figure 10A:
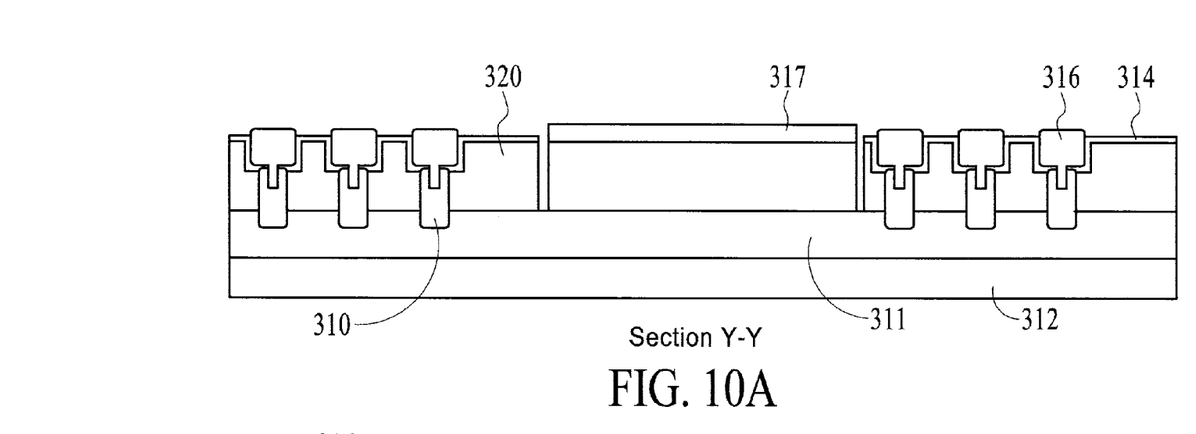
FIG. 10A is a cross-sectional view of the MWT solar cell of FIG. 9 after the further step of backside via filling, according to some embodiments of the present invention.
Figure 10B:
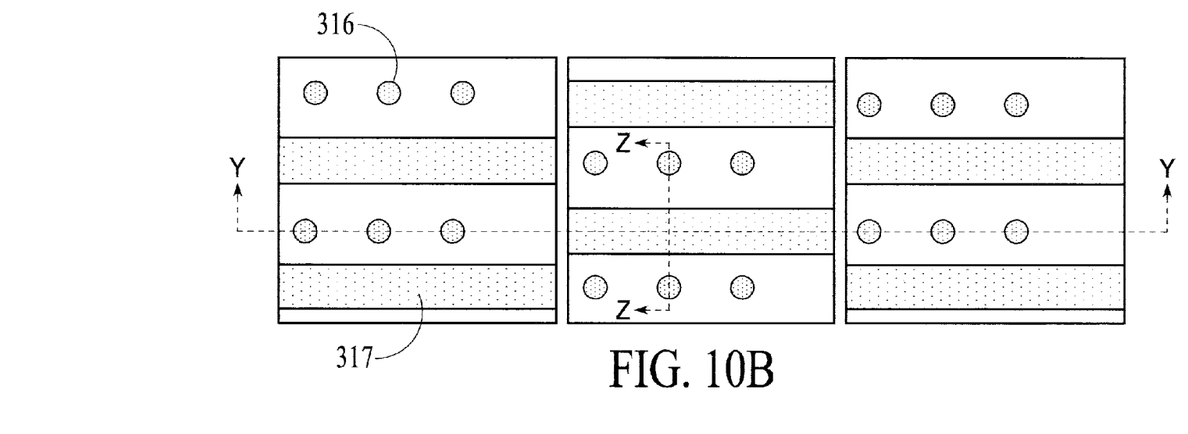
FIG. 10B is a top view of the backside of the MWT solar cell of FIG. 10A.

Next, aluminum (often deposited as a sandwich comprising Al and V, to prevent oxidation and allow solderability) stripes are deposited over the field regions while the frontside busbars are protected by a shadow mask. This is followed by depositing conducting paste (silver-filled epoxy epoxy or a low temperature colloidal silver paste) in the backside vias using a syringe-type dispense technique or a screen printing process. See FIG. 10A. The same conducting paste is also deposited on the aluminum stripes at the position of the back contacts to the $p^{++}$ layer, for making the P tabs. The curing temperature of the silver paste should be sufficiently low such that the module encapsulant (that attached the thin cells to solar glass) is not degraded. FIG. 10B is a top view of the backside of the three solar cells showing back contact stripes 317 and filled backside vias 316 contacting the front of the cells.

Figure 11:
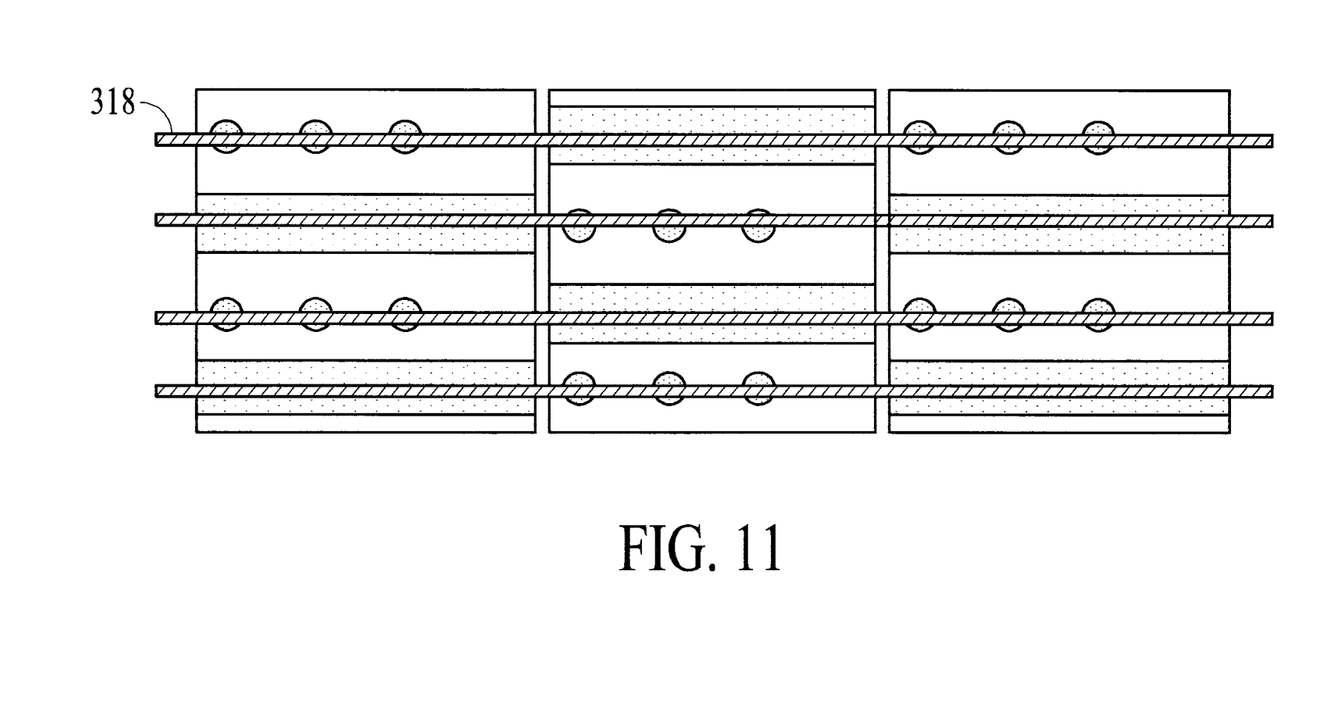
FIG. 11 is a top view of the MWT solar cell of FIG. 10B after the further step of tab attachment, according to some embodiments of the present invention.

FIG. 11 shows a top view of the same three wafers of FIG. 10B, showing the frontside and backside silver contacts, and the way in which the separate solar cells are connected together using straight line tabs 318. After straight line tabs are applied, there is a final lamination with ethylene vinyl acetate (EVA) encapsulant and a Tedlar® polyvinyl fluoride (PVF) backsheet. (The latter lamination process may also be effective in curing the conducting paste.)

The second embodiment for this unique MWT approach is shown in schematic cross-section in FIGS. 12-17. This embodiment does not require the front side vias but may have less process margin than the first embodiment due to the need to drill the backside vias completely and yet stop on Ag while accounting for thickness variation of the epitaxial silicon layers. Conversely, the second embodiment may have a higher process margin and lower cost if the laser drilling (and other methods for drilling vias) allows for a highly selective way to stop on the Ag busbar after drilling through the silicon, due, for example, to a very large difference in the drilling rate of the silicon and metal—the drilling rate of the metal being the lesser. Note that the cross-sections of FIGS. 12-17 are perpendicular to the cross-sections of FIGS. 3B, 4-9 and 10A-FIG. 10B shows the cross-sectional plane Z-Z for FIGS. 12-17. (The structures of the first and second embodiments are different; however, the basic layout of the contacts is the same—as shown in FIGS. 10B and 11.) The cross-sections of FIGS. 12-17 show both frontside and backside contacts for a single cell.

Figure 12:
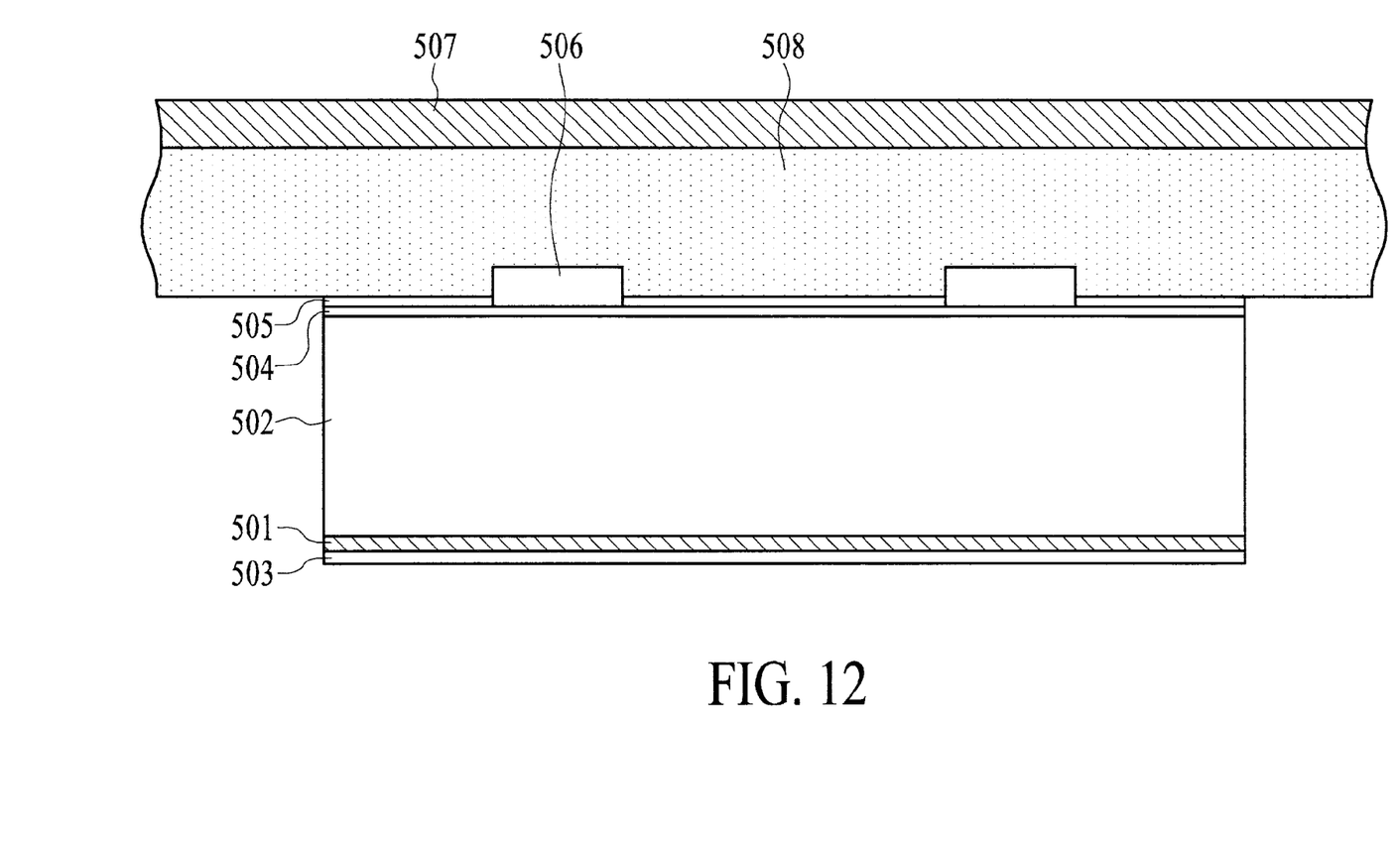
FIG. 12 is a cross-sectional view of a representation of the fabrication of a MWT solar cell showing the cell after frontside processing, according to a second embodiment of the present invention.

FIG. 12 shows an epitaxial silicon thin film structure which has been exfoliated from the silicon substrate on which the epitaxial layers were grown. The structure of FIG. 12 may be fabricated using processes such as described in U.S. patent application publication nos. 2010/0108134, 2010/0108130, 2009/0227063 and 2011/0056532, all incorporated by reference herein. The epitaxial silicon thin film structure is attached to a solar glass 507 with an encapsulant 508 prior to separation of the epitaxial layers from the silicon substrate; ordinarily multiple epitaxial silicon thin film structures are attached to a single sheet of solar glass to make a solar module as described above. Frontside metal grid lines 506 (and/or portion of the busbar) were deposited prior to separation from the silicon substrate; methods such as screen printing may be used to deposit the grid lines 506. The silicon epitaxial layers are roughly in the range of 20-50 microns thick and include a $p^+$ BSF (back surface field) layer 501 and a $p^-$ layer 502. The $p^+$ BSF (back surface field) epitaxial layer 501 is on the backside and is covered by the remains of the porous silicon separation layer 503. There is an $n^+$ emitter 504 covered by a silicon nitride ARC/passivation layer 505 on the frontside.

Figure 13:
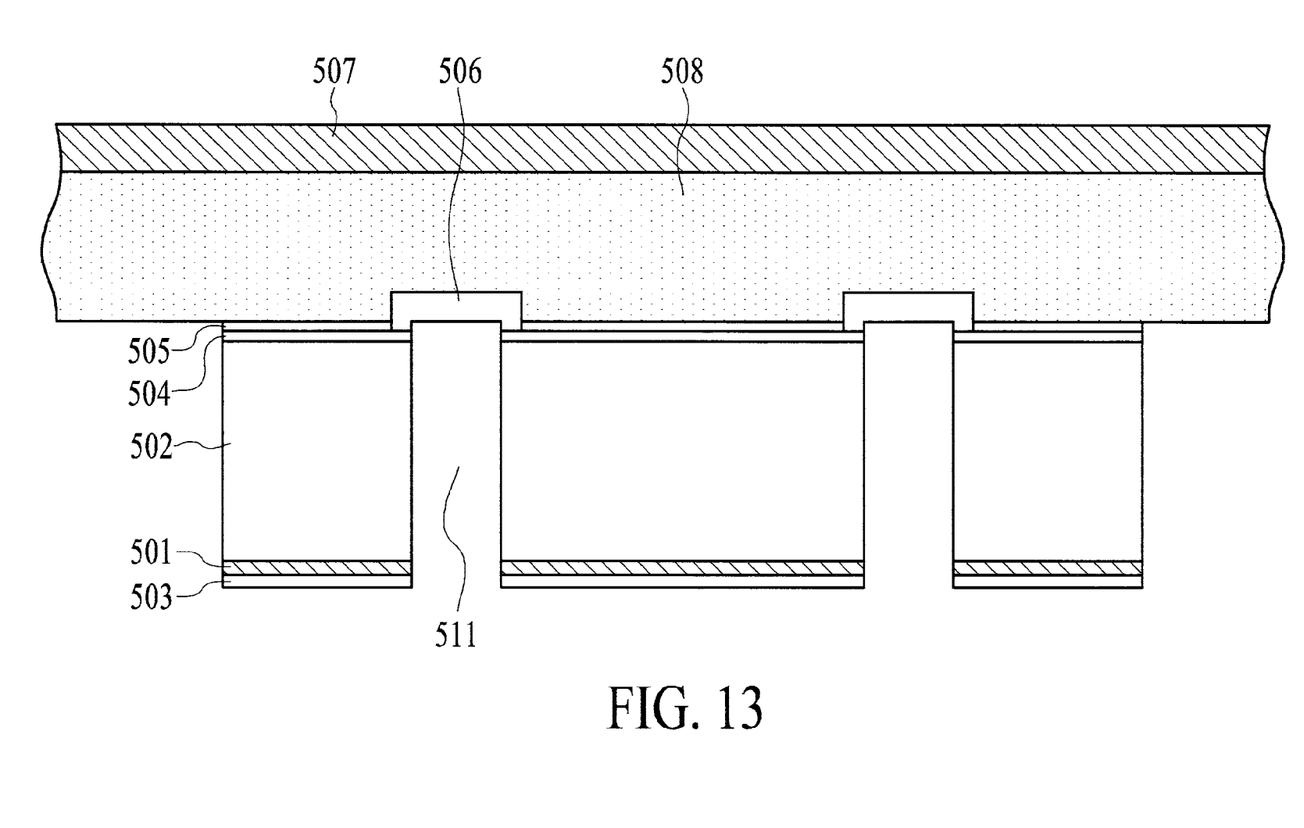
FIG. 13 is a cross-sectional view of the MWT solar cell of FIG. 12 after the further step of backside via formation, according to some embodiments of the present invention.
Figure 14:
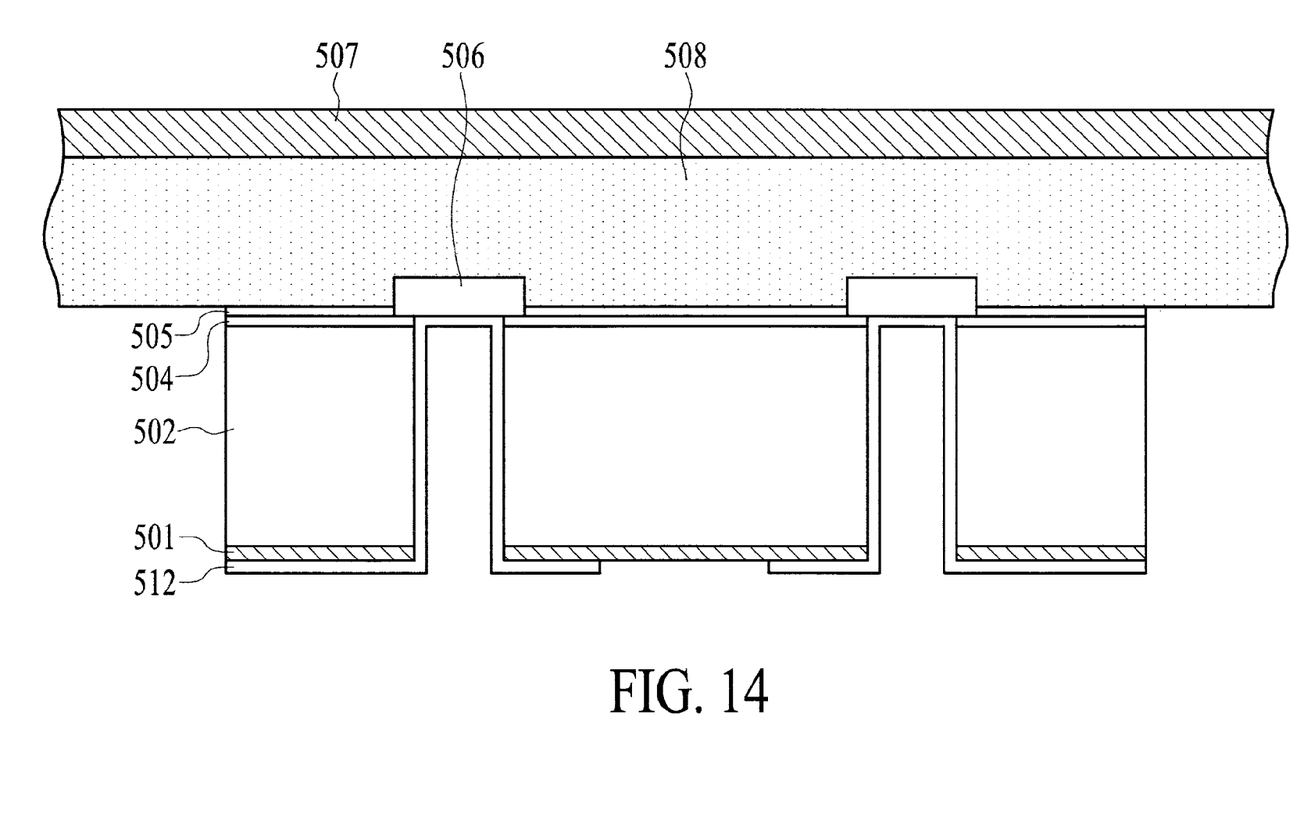
FIG. 14 is a cross-sectional view of the MWT solar cell of FIG. 13 after the further step of backside conformal dielectric deposition, according to some embodiments of the present invention.
Figure 15:
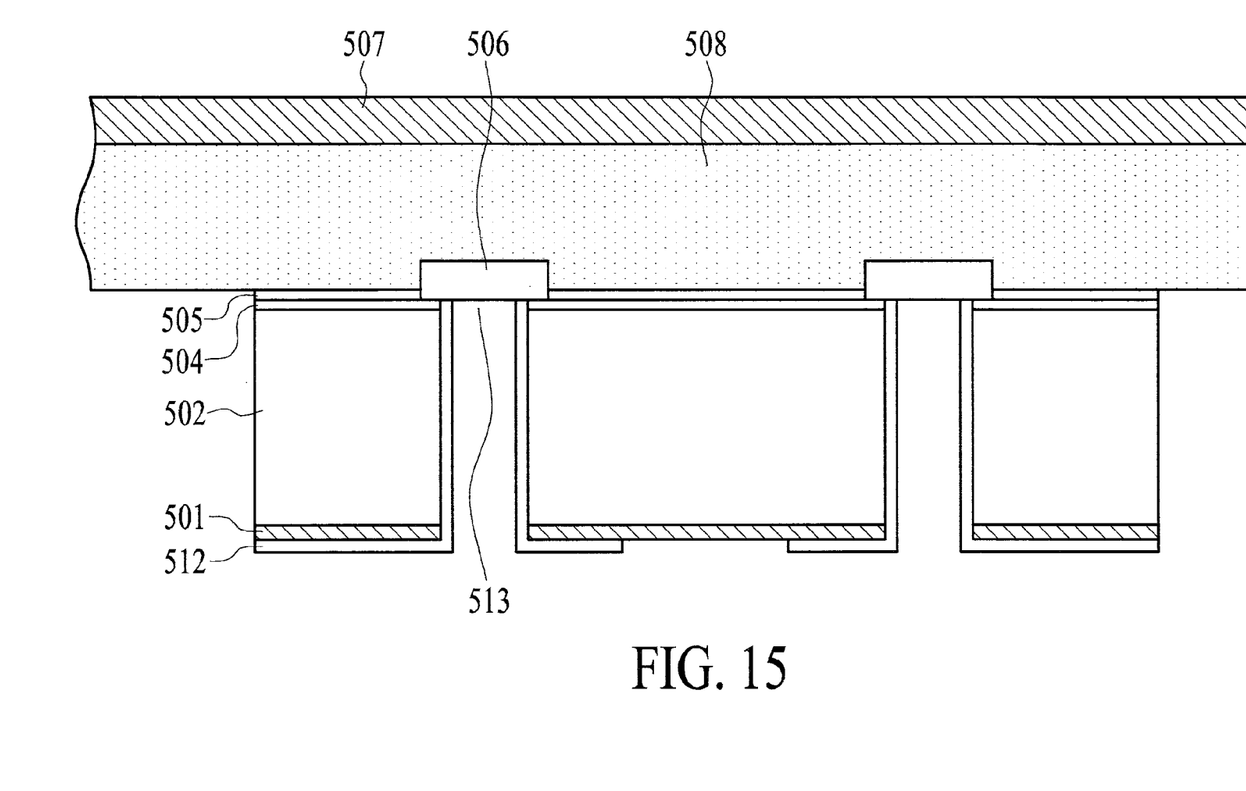
FIG. 15 is a cross-sectional view of the MWT solar cell of FIG. 14 after the further step of removal of the dielectric from the bottom of the vias, according to some embodiments of the present invention.
Figure 16:
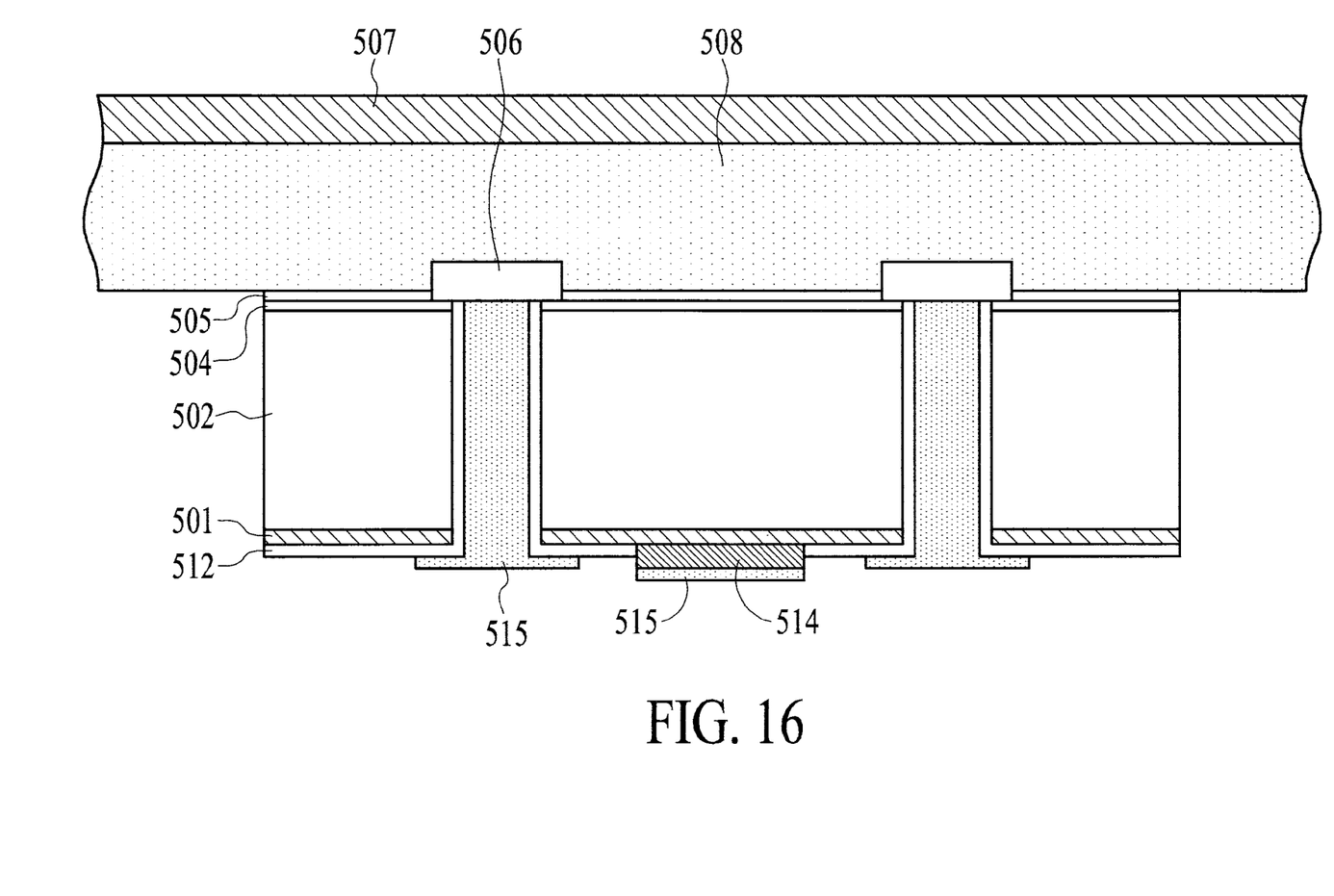
FIG. 16 is a cross-sectional view of the MWT solar cell of FIG. 15 after the further step of backside metallization according to a first scheme, according to some embodiments of the present invention.
Figure 17:
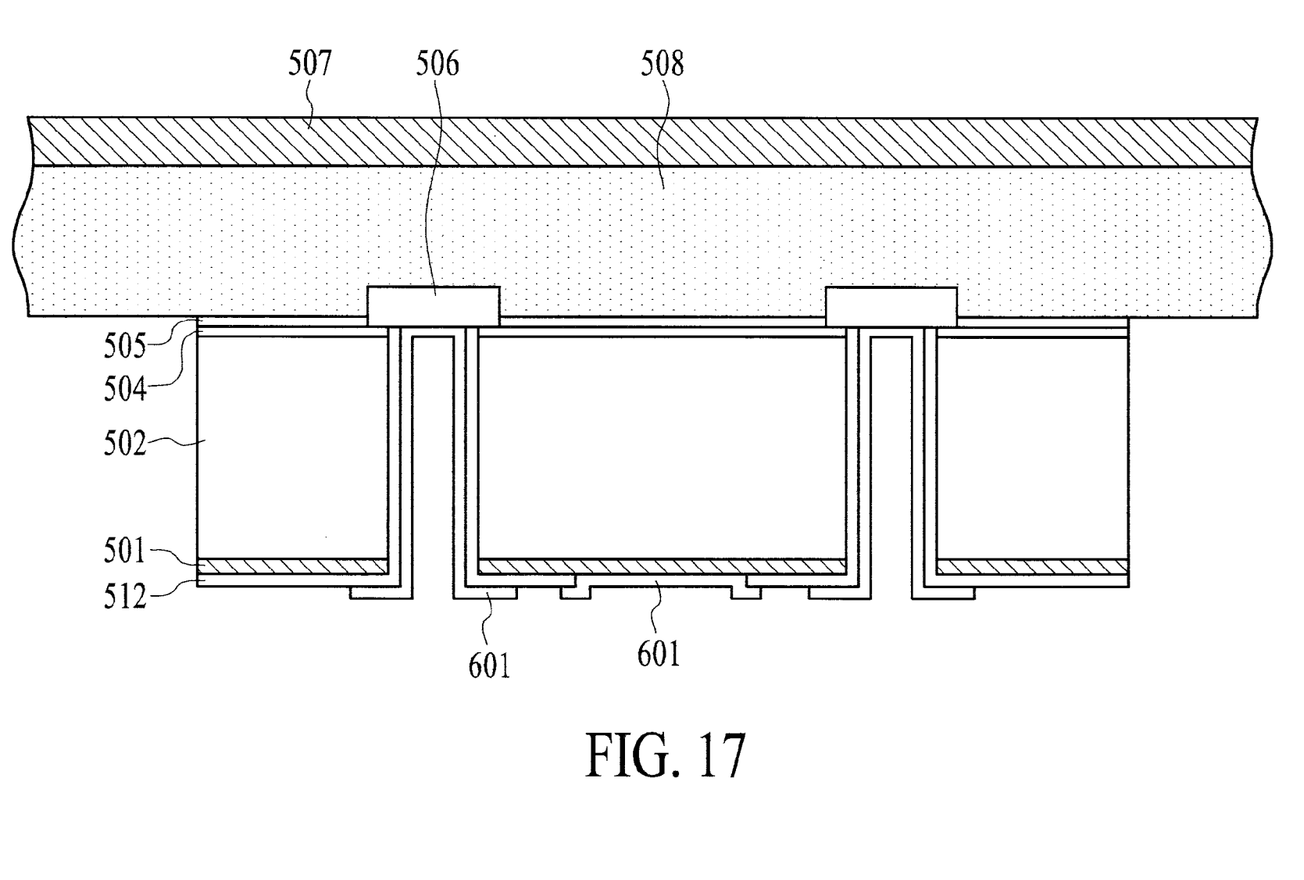
FIG. 17 is a cross-sectional view of the MWT solar cell of FIG. 16 after the further step of backside metallization according to a second scheme, according to some embodiments of the present invention.

In FIG. 13, laser vias 511 are drilled from the back of the exfoliated thin epitaxial silicon. The laser via must be fabricated such that the via is terminated at the front metal gridline or pad 506 with minimal loss of metal.

The entire backside is now cleaned up to remove the remaining porous silicon and any laser damaged regions—this may be done in one wet chemical step, such as a hot KOH etch. A thin conformal dielectric layer 512, such as SiN or sputtered quartz or undoped amorphous silicon, is then deposited on the entire backside with certain areas protected by a shadow mask during deposition. The dielectric acts as a passivation layer and optical confinement enhancer for the backside $p^+$ layer 501, and also acts as an insulator in the via—separating the hole current from the electron current. See FIG. 14.

The dielectric is then selectively removed from the areas 513 in the via region where the SiN is contacting the frontside metal by a second "touchup" laser ablation to enable an electrical contact to the front gridline/pad 506. See FIG. 15.

The backside surface is metalized, with Al metallization for example, in one of two ways:

By the first method (FIG. 16), aluminum 514 is deposited in the areas that contact the base (in the regions masked during SiN deposition). The laser vias are then filled with Ag-filled epoxy 515 in a separate step, using a syringe-type dispense technique or a screen printing process, for example. The Ag-filled epoxy may also be applied to the Al layer base contacts to assist with attachment to the tabbed interconnections between cells.

The second, alternate, method uses a blanket Al (or Al/V sandwich) 601 deposition by a physical vapor deposition method such as sputtering or e-beam evaporation to fill the vias and form base contacts simultaneously. The deposition should be done in such a manner so as to create isolation between the emitter and base metallization either by a suitable shadow mask employed during the Al deposition, or selective removal of metal by laser to create insulation from the front and backside metallizations. See FIG. 17.

Cell to cell interconnects may be established as in the first embodiment and depicted in FIG. 11.

All back Aluminum co-fired contacts are typically employed in silicon solar cells since they serve the dual purpose of creating an Al-doped $p^{++}$ back surface field (BSF), in addition to improving back contacts to the base. However, this method does not result in an optimal BSF structure and may induce a how in thin silicon wafers. A single crystal silicon solar cell with an insitu $p^{++}$ BSF with p-type epitaxial silicon will obviate the need for the conventional Al screen printing step, thus enabling a thinner silicon solar cell since high temperature Al firing is eliminated and thereby issues relating to bowing and attendant stresses are also eliminated. For example, as part of the epitaxial silicon deposition an epitaxial film of $p^{++}$ silicon BSF (resistivity of 1-3 mohm-cm) may be deposited on the annealed surface of the porous silicon layer, approximately 1-10 microns thick, in the epitaxial deposition reactor, followed by epitaxial deposition of the base on top of the BSF. The epitaxial solar cell design including epitaxially deposited BSF is important since it eliminates the need for an all metal back contact, instead of using the $p^{++}$ layer to contact a metal grid (where the grid may have 5% surface coverage) or other configurations of metal point contacts, for example. The metal grid may be formed from, for example: Al/Ag pastes, frits, or epoxies; plated Ni and/or plated Ti/Pd/Ag. The epitaxial cell of the present invention with the epitaxially deposited BSF may include the following advantages over a conventional cell: lower cell manufacturing cost since full Al back contact screen printing is avoided and thinner silicon is enabled.

Furthermore, the methods of the present invention for fabricating MWT contacts may be employed with minor changes to be applicable to n-type solar cells, as well as to other device architectures such as rearside emitter with or without front surface field (FSF).

Embodiments of the present invention may provide one or more of the following advantages. Embodiments of the present invention utilize the planar back contact geometry of base and emitter contacts to simplify process flows and assembly methods, thereby reducing cell handling and breakage during stringing and tabbing, as compared with stringing and tabbing practiced for conventional front-to-back contact geometries—this facilitates the application of metal wrap through technology to a wider range of structures, such as thin silicon. Some embodiments of the present invention allow sequential access to the front and backside of solar cells with passivated base and local back contacts, facilitating high cell efficiencies at high frequencies. Some embodiments of the present invention include processes with front and backside partial vias, which may increase process margins. Some embodiments of the present invention require only a single screen printing (as opposed to 3 in the conventional MWT process), followed by a low-cost, large format Al deposition by evaporation or sputtering. Some embodiments of the present invention are processes that may be employed with a single dielectric layer on the backside for both optical confinement and passivation; furthermore, the same dielectric layer may be utilized for the via liner.

Although specific examples have been provided of filling vias with Ag filled epoxy and applying Ag filled epoxy to base contacts, a wide range of conductive pastes may be used for these purposes in the present invention.

Although the present invention has been described with reference to embodiments which include an epitaxially deposited BSF, the principles and concepts of the present invention may be applied to solar cells without a BSF, solar cells without an epitaxially deposited BSF, and solar cells with a BSF formed by other methods. For example a BSF may be formed by ion implantation of the base, or by other suitable methods.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A method of fabricating a metal wrap through solar cell comprising:
    forming a plurality of blind vias in a front surface of a base layer, said plurality of blind vias extending only part way through said base layer;
    forming an emitter on said front surface of said base layer;
    depositing an antireflective coating over said emitter;
    filling said plurality of blind vias with an electrically conductive material to form a plurality of filled blind vias;
    depositing busbars over said front surface of said base layer, said busbars being configured to connect to said plurality of filled blind vias;
    attaching said front surface of said processed base layer to a solar glass using an encapsulant;
    forming a plurality of vias from a back surface of said base layer through said base layer, said plurality of vias terminating in said plurality of filled blind vias;
    depositing a conformal dielectric film over all surfaces of said plurality of vias and said back surface of said base layer;
    removing first portions of said conformal dielectric film from all ends of said plurality of vias for exposing said plurality of filled blind vias and removing second portions of said conformal dielectric film from field areas of said base layer; and
    forming first electrical contacts to said plurality of filled blind vias and forming second electrical contacts to said field areas, wherein said first electrical contacts and said second electrical contacts are all accessible on a back surface of said solar cell, and wherein said first electrical contacts are electrically isolated from said second electrical contacts.

2. The method of claim 1, wherein said base layer is epitaxial silicon.

3. The method of claim 2, wherein said base layer is less than 50 microns thick.

4. The method of claim 2, wherein said base layer is attached to a porous silicon separation layer during said forming said plurality of blind vias, said forming an emitter, said depositing an anti-reflective coating, said filling said blind vias, said depositing busbars, and said attaching, and wherein said porous silicon separation layer is formed on the surface of a silicon substrate.

5. The method of claim 4, further comprising, after said attaching, separating said processed base layer from said silicon substrate.

6. The method of claim 1, wherein said forming first electrical contacts and second electrical contacts includes depositing conducting material in said plurality of vias and on said field areas of said base layer.

7. The method of claim 1, wherein said base layer includes an epitaxially deposited back surface field layer on said back surface of said solar cell.

8. The method of claim 7, wherein said forming second electrical contacts includes forming a metal grid on said field areas.

9. The method of claim 1, wherein said attaching process is the attaching in an array of a multiplicity of processed base layers to said solar glass.

10. The method of claim 1, wherein said emitter is also formed on all surfaces of said plurality of blind vias.

11. The method of claim 10, wherein said antireflective coating is also formed on all surfaces of said emitter formed on all surfaces of said plurality of blind vias.

12. A metal wrap through solar cell comprising:
    a base layer;
    an emitter on a front surface of said base layer;
    an antireflective coating over said emitter;
    a plurality of blind vias in said front surface of said base layer, said plurality of blind vias extending only part way through said base layer, said plurality of blind vias being filled with an electrically conductive material;
    busbars over said front surface of said base layer, said busbars being configured to connect to said electrically conductive material in said plurality of blind vias;
    a plurality of vias from a back surface of said base layer through said base layer, said plurality of vias terminating in said plurality of blind vias, all surfaces of said plurality of vias, except where said plurality of vias meets said plurality of blind vias, being coated with a conformal dielectric film;
    first electrical contacts to said electrically conductive material in said plurality of filled blind vias, said first electrical contacts extending from a back surface of said solar cell through said plurality of vias; and
    second electrical contacts to field areas on the back surface of said base layer;
    wherein said first electrical contacts and said second electrical contacts are all accessible on said back surface of said solar cell, and wherein said first electrical contacts are electrically isolated from said second electrical contacts.

13. The metal wrap through solar cell of claim 12, wherein said emitter also coats all surfaces of said plurality of blind vias, except portions of surfaces at all blind ends of said plurality of blind vias.

14. The metal wrap through solar cell of claim 13, wherein said antireflective coating also coats all surfaces of said emitter formed on said surfaces of said plurality of blind vias.

15. The metal wrap through solar cell of claim 12, further comprising a sheet of solar glass over said front surface of said base layer.

16. The metal wrap through solar cell of claim 15, further comprising a layer of encapsulant between said front surface of said base layer and said sheet of solar glass.

17. The metal wrap through solar cell of claim 12, wherein said base layer is epitaxial silicon.

18. The metal wrap through solar cell of claim 17, wherein said base layer is less than 50 microns thick.

19. The metal wrap through solar cell of claim 12, wherein said base layer includes an epitaxially deposited back surface field layer on said back surface of said solar cell.

* * * * *